(12) United States Patent
Lifka et al.

(10) Patent No.: US 8,766,306 B2
(45) Date of Patent: Jul. 1, 2014

(54) TRANSPARENT LIGHT EMITTING DEVICE WITH CONTROLLED EMISSION

(75) Inventors: Herbert Lifka, Son (NL); Sören Hartmann, Baesweiler (DE); Herbert Friedrich Boerner, Aachen (DE); Christoph Rickers, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/704,730

(22) PCT Filed: Jun. 15, 2011

(86) PCT No.: PCT/IB2011/052587
§ 371 (c)(1),
(2), (4) Date: Dec. 17, 2012

(87) PCT Pub. No.: WO2011/158185
PCT Pub. Date: Dec. 22, 2011

(65) Prior Publication Data
US 2013/0092914 A1    Apr. 18, 2013

(30) Foreign Application Priority Data
Jun. 18, 2010   (EP) ..................................... 10166522

(51) Int. Cl.
*H01L 33/00*     (2010.01)
*H01L 29/80*     (2006.01)
*H01L 31/112*    (2006.01)
*H01L 21/00*     (2006.01)
*H01L 51/40*     (2006.01)

(52) U.S. Cl.
USPC ................ 257/98; 257/40; 257/79; 257/257; 438/27; 438/29; 438/82; 438/99

(58) Field of Classification Search
USPC ............... 257/40, 13, 99, 79, 257, 82, 88, 98; 438/22, 24, 46, 47, 48, 27, 29, 82, 99
See application file for complete search history.

(56) References Cited

U.S. PATENT DOCUMENTS 5,902,688 A     5/1999    Antoniadis et al.
7,612,496 B2    11/2009   Cok
(Continued)

FOREIGN PATENT DOCUMENTS

JP    2003249379 A    9/2003
WO    03107390 A2    12/2003
(Continued)

*Primary Examiner* — Matthew Reames
*Assistant Examiner* — Dilinh Nguyen
(74) *Attorney, Agent, or Firm* — Yuliya Mathis

(57) ABSTRACT

A light emitting device and a method for manufacturing the light emitting device are disclosed. In one example, the light emitting device includes a transparent substrate, partially transparent an anode layer or layer assembly arranged on said substrate, a light emitting layer arranged on said anode layer, and a transparent cathode layer arranged on said light emitting layer, wherein said anode layer or layer assembly includes a first surface facing said transparent substrate and a second surface facing said light emitting layer and is positioned opposite to said first surface, said first surface includes a transparent conductive material, said second surface includes first and second domains, said first domains are conductive and non-transparent, said second domains are transparent and electrically isolating, and said first domains are in direct contact with said light emitting layer and are arranged to allow electrical contact between said first surface and said light emitting layer.

9 Claims, 6 Drawing Sheets

(56) References Cited

U.S. PATENT DOCUMENTS

| | | |
|---|---|---|
| 2005/0088080 A1* | 4/2005 | Cheng et al. .................. 313/504 |
| 2005/0199874 A1* | 9/2005 | Yamazaki et al. ............. 257/40 |
| 2008/0122351 A1 | 5/2008 | Kitazume |

FOREIGN PATENT DOCUMENTS

| | | |
|---|---|---|
| WO | 2007113707 A1 | 10/2007 |
| WO | 2010005301 A1 | 1/2010 |
| WO | 2010046833 A1 | 4/2010 |

\* cited by examiner

TRANSPARENT LIGHT EMITTING DEVICE WITH CONTROLLED EMISSION

FIELD OF THE INVENTION

The invention relates to transparent light emitting devices with emission control.

BACKGROUND OF THE INVENTION

Organic light emitting devices are based on the principle that an organic light emitting layer is disposed between two electrodes, wherein one of the electrodes is at least partly transparent so that light can be emitted. By using an electrode with high transparency, high emission and hence high efficiency can be achieved. Currently, development is focused on transparent organic light emitting devices (OLEDs), where both electrodes are at least partly transparent. Therefore, transparent OLED devices are emissive in both the frontside and backside simultaneously. For several applications, it may be desired to have emission in both directions. However, for other applications it would be preferred to control the emission directions. For example, it may be advantageous to have a high transparency combined with reduced or even no emission from the backside and good emission from the front of the light emitting device.

In WO2010/046833A an OLED is described comprising an organic layer between an anode and a cathode, and a mirror layer on the anode or the cathode, wherein the mirror layer is structured into nontransparent zones and transparent zones. The OLED can be completely or partly deactivated in the transparent zones. By this structure the OLED can be made transparent for light and simultaneously the emission can be controlled to a certain degree. The non-transparent mirror zones block light emission and reflect light into the desired direction.

However, there is still a need in the art for solutions that provide improved emission control of transparent light emitting devices.

SUMMARY OF THE INVENTION

It is an object of the present invention to at least partly overcome the problems of the prior art, and to provide a light emitting device with improved emission control and an advantageous method of manufacturing such a device.

According to a first aspect, the invention relates to a light emitting device comprising: a transparent substrate; a partially transparent anode layer or anode layer assembly arranged on the substrate; a light emitting layer arranged on the anode layer; and a transparent cathode layer arranged on the light emitting layer; wherein the anode layer or anode layer assembly comprises a first surface facing the substrate and a second surface facing the light emitting layer, the second surface being positioned opposite to the first surface; the first surface comprises a transparent conductive material; the second surface comprises first and second domains; the first domains are conductive and non-transparent; the second domains are transparent and electrically isolating; and the first domains are in direct contact with the light emitting layer and are arranged to allow electrical contact between the first surface and the light emitting layer. Thereby, very efficient control of the emission directions is achieved. For example, the invention allows for the production of improved single-side emissive transparent OLED devices, and the production of transparent light emitting devices emitting light of one color on one side, and light of a second color on the opposite side of the device. At the same time as high control of the emission directions can be achieved, the light emitting device can be produced to have high optical transparency.

In embodiments of the invention, the first surface of the anode of the light emitting device comprises a conductive polymer. By using a conductive polymer, light emitting devices with improved flexibility can be obtained.

In embodiments of the invention, the first surface of the light emitting device comprises at least one conducting oxide, such as an ITO or AlZnO material. By using an oxide material for the first surface, the risk for damage during the production of the next layer is achieved, as for example the second surface of the anode can be produced using selective oxidation without concern of whether the first surface will be influenced by the oxidation, since the first layer already is in the form of an oxide.

In embodiments of the invention, the first domains of the second surface of the anode comprise a metal or alloy, preferably an electroplated metal such as Ag, Pd, Ni, Al, Cu etc. By using a metal or alloy, highly conductive surfaces can be produced. In the case where an electroplated metal is used, this provides for the possibility to lower the production costs.

In embodiments of the invention, the second domains of the anode of the light emitting device comprise an isolating transparent polymer. By using an isolating transparent polymer, light emitting devices with improved flexibility can be obtained.

In embodiments of the invention, the second domains of the anode layer of the light emitting device comprise a glass, such as $SiO_2$. By using a glass material, high transparency can be obtained. Also, ceramic materials such as SiN or AlO can be used.

In embodiments of the invention, the second surface of the light emitting device comprises a metal layer having the first and second domains, which comprises at least one metal or alloy which is in non-oxidized form in the first domains and oxidized in the second domains. By using a metal layer having such first and second domains, it is possible to achieve a light emitting device having efficient alternating conductive non-transparent domains and transparent non-conductive domains at low cost. In addition, it provides for the possibility to produce a device by relatively few manufacturing steps.

In embodiments of the invention, the anode layer of the light emitting device may consist of at least one metal or alloy layer which is partly in oxidized form, wherein the first surface and the first domains are in non-oxidized form, and the second domains are in oxidized form. By using a metal layer having such first and second domains and such first surface, it is possible to achieve an efficient light emitting device having alternating conductive non-transparent domains and transparent non-conductive domains and a conductive first surface at low cost. In addition, it provides for the possibility to produce a device by relatively few manufacturing steps.

In embodiments of the invention, the light emitting device further comprises an additional light emitting layer arranged on the cathode; and an additional partly transparent anode layer or anode layer assembly arranged on the additional light emitting layer, wherein the additional anode layer or anode layer assembly comprises a first surface facing the additional light emitting layer and a second surface positioned opposite to the first surface; the first surface comprises first and second domains; the first domains are conductive and non-transparent; the second domains are transparent and electrically isolating; the second surface comprises a transparent conductive material, and wherein the first domains are in direct contact with the light emitting layer and are arranged to allow electrical contact between the second surface and the light emitting layer. By using such arrangement of layers it is possible to achieve a device which has the possibility of very advanced emission control. For example, it is possible to produce two different colors or light patterns emitting in opposite directions, from different sides of the device.

According to a second aspect, the invention relates to an OLED comprising a light emitting device according to described above wherein the light emitting layer comprises an organic material. The OLED may be a flexible OLED, and may be applied in for example lamps, endoscopes, windows or security applications. By using the light emitting device of the invention in an OLED, high flexibility can be achieved at the same time as the emission directions can be controlled. In addition, high transparency of the device is maintained.

According to a third aspect, the invention relates to a method for manufacturing a light emitting device as described above, comprising: providing a transparent substrate; providing a partly transparent anode layer or anode layer assembly on the substrate having a first transparent and conducting surface facing the substrate, wherein the anode layer or anode layer assembly is provided with first domains of a non-transparent conductive material and with second domains of a transparent electrically isolating material, providing a light emitting layer on the anode layer or anode layer assembly; and providing a transparent cathode layer on the light emitting layer, wherein the first domains are in direct contact with the light emitting layer and are arranged to allow electrical contact between the first surface and the light emitting layer. Thereby, a light emitting device having the advantages described above can be produced. Further, the method allows for a cost-efficient way of producing a light emitting device with possibility of high transparency, high flexibility, and controlled emission.

In embodiments of the invention, the anode layer assembly is provided by applying a first sub-layer of a transparent conductive material on the substrate; and applying a discontinuous second sub-layer of a transparent and electrically isolating material to partially cover the first sub-layer; applying a non-transparent conductive material to areas of said first sub-layer that are not covered by said discontinuous second sub-layer. Thereby, the materials of the first and second surfaces can be varied, so that the materials can be optimized in terms of function and in terms of minimized risk for material degradation during the manufacturing of the light emitting device.

In embodiments of the invention, the anode layer is provided by applying a first sub-layer of a transparent conductive material; applying a second sub-layer of a metal or alloy; and selectively oxidizing the second sub-layer, hence forming the first and second domains. Thereby, a cost-efficient method is provided as the method only involves one application step for both the first and second domains.

In embodiments of the invention, selective oxidation is performed by partially covering the second sub-layer; oxidizing uncovered domains of the second sub-layer. Thereby, it is possible to achieve a device having alternating conductive non-transparent domains and transparent non-conductive domains. Further, no etching steps are needed.

In embodiments of the invention, the anode layer is provided by applying a layer of a metal or alloy; selectively oxidizing the surface of the layer to a predetermined depth, thereby forming the first surface and the first domains of conducting material and the second domains of non-conducting material. Thereby, a cost-efficient method is provided as the method only involves one single application step for an anode layer comprising the first and second domains of the second surface and a first surface.

In embodiments of the invention, applying the anode layer may comprise using electroplating of a metal. The advantage of using electroplating is that it requires no extra steps compared to production of standard transparent OLEDs, and that electroplating is a low-cost metal deposition step. Also, the process is simpler to control than other deposition processes such as the selective oxidation process.

It is noted that the invention relates to all possible combinations of features recited in the claims.

BRIEF DESCRIPTION OF THE DRAWINGS

These and other aspects of the present invention will now be described in more detail, with reference to the appended drawings showing embodiment(s) of the invention.

DETAILED DESCRIPTION OF THE INVENTION

Figure 1:
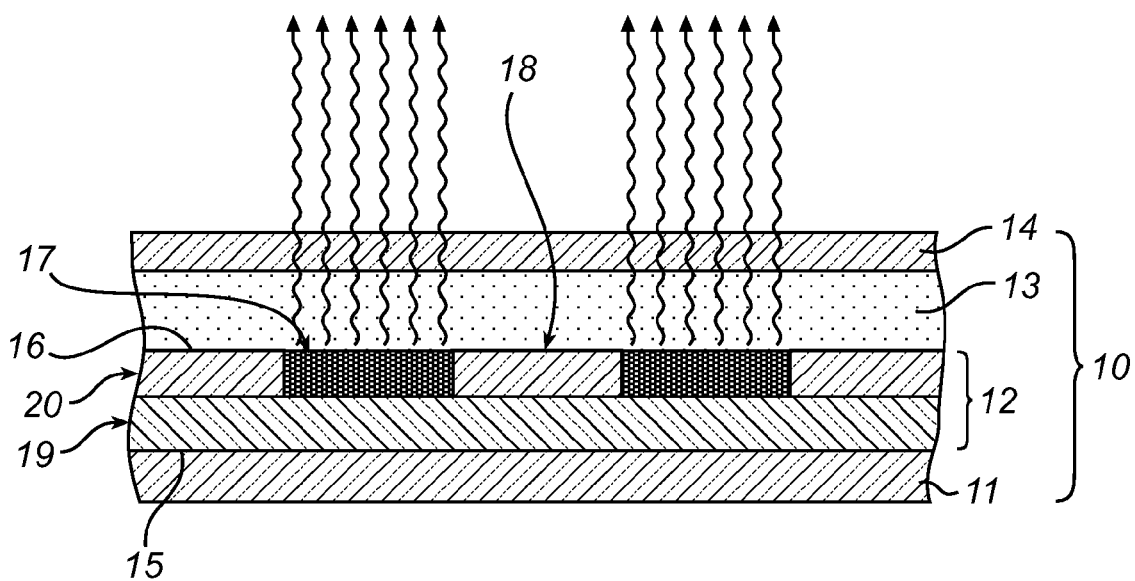
FIG. 1 shows a first example of a light emitting device according to the invention.

The present invention relates to a transparent light emitting device with the possibility to control the emission directions, a method for manufacturing thereof, and the use of the device in transparent OLEDs, such as flexible transparent OLEDs. The device is especially useful as a lamp, in endoscopes, in signs for windows or in security applications. In the following detailed description, preferred embodiments of the invention will be described. However, it is to be understood that features of the different embodiments are exchangeable between the embodiments and may be combined in different ways, unless anything else is specifically indicated.

As illustrated in the figures, the sizes of layers and regions are exaggerated for illustrative purposes and, thus, are provided to illustrate the general structures of embodiments of the present invention. Like reference numerals refer to like elements throughout.

FIG. 1 illustrates an example of a light emitting device according to the invention. The light emitting device 10 comprises a transparent substrate 11; a partially transparent anode layer assembly 12 arranged on the substrate 11; a light emitting layer 13 arranged on the anode layer assembly 12; and a transparent cathode layer 14 arranged on the light emitting layer 13. The anode layer assembly 12 comprises a first surface 15 facing the substrate 11 and a second surface 16 facing the light emitting layer 13 and which is positioned opposite to the first surface 15. The first surface 15 comprises a transparent conductive material; the second surface 16 comprises first and second domains 17, 18. The first domains 17 are conductive and non-transparent, and the second domains 18 are transparent and electrically isolating. The first domains 17 are in direct contact with the light emitting layer 13 and are arranged to allow electrical contact between the first surface 15 and the light emitting layer 13. The inventors found that by using alternating conductive non-transparent domains 17 and non-conductive insulating domains 18, excellent control of the emission directions can be achieved. This light emitting device is advantageous for example since the surface or layer comprising isolating transparent domains and the conductive non-transparent domains allows for a very efficient control of the emission directions. The light emitting device is especially advantageous for OLEDs and OLED devices of single-side emissive type. It is also suited for quantum.dot devices.

The transparent substrate 11 may be a made of glass or plastic and may include a moisture barrier in order to prolong the life-time of the device. The substrate may be a flat substrate or a curved substrate, e.g. for lenses. The transparent anode layer assembly 12 may be made of two or more sub-layers wherein a lower layer may be made of an essentially transparent and conductive material forming the first surface 15, and an upper layer of alternating transparent electrically isolating material and non-transparent conductive material forming the second surface 16. As used herein, lower means nearer to the substrate 11 and upper means nearer to the light emitting layer 13.

As used herein, "transparent material" means a material which is semi-transparent, partly or completely transparent. For example, "transparent material" may relate to a material which allows at least 20% of the incident light to pass through the material. "Transparent" is also intended to include the possibility of allowing for light to be transported through the layer, for example by the layer forming a grid structure.

The anode layer assembly 12 of FIG. 1 will now be described in more detail. The anode may be produced by using a first sub-layer 19 and a second sub-layer 20 in contact with the first sub-layer, thereby forming a layer assembly 12. The first sub-layer 19 of the anode layer assembly can be made of an essentially transparent conducting oxide, for example ITO, or AlZnO materials, or a transparent conductive polymer. For example, the first sub-layer may be formed of a metal layer which is very thin, for example below 0.1 μm or which has a grid structure. The second sub-layer 20 may comprise, or may be formed of, alternating conductive non-transparent domains 17 (first domains) and non-conductive insulating domains 18 (second domains). The conductive non-transparent domains 17 are arranged in the layer to allow for electrical contact between the first sub-layer 19 and the light emitting layer 13. The first domains 17 of the second sub-layer 20 may be made of a non-transparent conducting polymer, conducting oxide or a conductive metal or alloy, such as Ag, Pd, Ni, etc, while the second domains 18 may comprise an isolating transparent polymer or a glass, such as $SiO_2$ or a ceramic material based on SiN, or AlO. Alternatively, the first domains 17 may be a stack of metals or alloys, e.g. comprising a first metal or alloy that provides good adhesion to the first sub-layer 19 and a second metal or alloy that provides good charge injection to the light emitting layer 13. For the adhesion promoting metals, also doped metals such as TiN or TiWN can be used.

Alternatively, the anode may be formed of a single layer having first and second surfaces, the second surface comprising said first and second domains.

The inventors found that there several preferred ways producing the anode layer assembly 12.

In a first example, the anode layer assembly of the light emitting device comprises a first sub-layer which is made of a conducting oxide such as an ITO or AlZnO, while the second-sub-layer is made of a partly oxidized metal or alloy material, for example Al. In the first domains of the second sub-layer, the metal or alloy is in non-oxidized form, while in the second domains of the metal or alloy is in oxidized form to provide isolation.

In a second example, the whole anode layer assembly 12 of the light emitting device is made of metal or alloy, wherein metal or alloy in non-oxidized form forms a first sub-layer and a second metal sub-layer is partly oxidized to form first non-oxidized domains to provide conductivity, and second oxidized domains to provide electrical isolation. In this example, the thickness of the first sub-layer is chosen to be thin enough to allow for light to be transported through the first sub-layer. Alternatively the first sub-layer may be discontinuous, and provide for light transmission through spaces in the grid.

In a third example, the anode layer assembly 12 comprises a first sub-layer of a conductive oxide such as ITO, the conductive first domains 17 are made of a metal or alloy and the second domains 18 are made of $SiO_2$.

Preferably, much less than 70% of the second surface 16 is covered by non-transparent domains. For example, about 10-50% of the surface may be covered by non-transparent domains. Alternatively, even less of the second surface 16 may be covered by non-transparent domains, such as below 10%. The shape and arrangement of the conductive domains can be chosen freely, depending on the desired appearance. For example, square, rectangular, circular, grid, or honeycomb shaped dots can be used. The first domains may be arranged in regular patterns of first domains or in a random fashion in the anode layer. The latter arrangement has the advantage that interference and Moiré effects can be reduced or suppressed. Other shapes than dots, e.g. stripes, concentric circles are also possible, thus providing more design freedom in the final appearance, especially for implementations where the metal areas are visible.

The light emitting layer 13 may be made of one or several layers of conventional light active materials. Light active material may be made of an organic material, such as an organic phosphor, or may comprise a ceramic phosphor material. Examples of suitable materials include quantum dot materials.

The transparent cathode layer 14 may be made of a metal layer, such as silver layer. In order to achieve an essentially transparent cathode layer, the metal layer may be formed from a very thin metal layer, such as below 100 μm. Alternatively, the transparent cathode layer may be made of a conductive oxide, a polymer or a discontinuous layer or a grid structured metal layer.

In addition, the light emitting device may comprise additional functional layers such as charge transport layers, charge injection layers etc.

Figure 2:
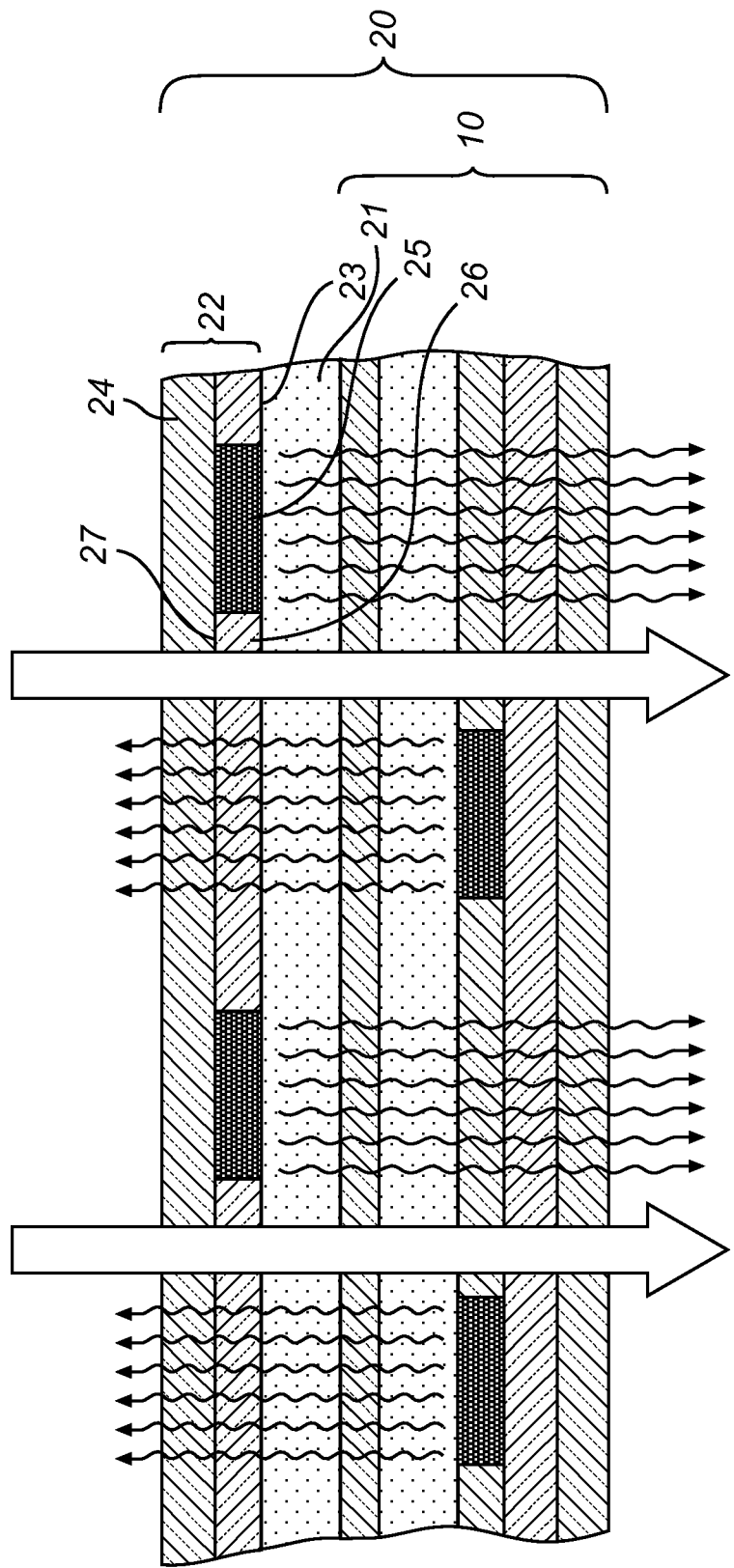
FIG. 2 shows a second example of a light emitting device according to the invention.

FIG. 2 illustrates another example of a light emitting device according to the invention.

This light emitting device 20 has the same layer structure 10 as the device in FIG. 1, and it further comprises an additional light emitting layer 21 arranged on the cathode layer 14; and an additional partly transparent anode layer assembly 22 arranged on the additional light emitting layer 21. The additional anode layer assembly 22 comprises a first surface 23 facing the additional light emitting layer 21 and a second surface 27 positioned opposite to the first surface. The first surface 23 comprises first and second domains 25, 26. The first domains 25 are conductive and non-transparent, while the second domains 26 are transparent and electrically isolating. The second surface 27 comprises a transparent conductive material, and the first domains 25 are in direct contact with the light emitting layer 21 and are arranged to allow electrical contact between the second surface 27 and the light emitting layer 21. The first and second domains 25, 26 may be as described above for domains 17, 18.

It is noted that the anode layer assembly 22 may be replaced by a single anode layer having said first and second surfaces, the second surface comprising said first and second domains as described herein.

As illustrated in this figure, the light emitting device 20 may emit light in two directions. Light emitted in different direction may be of different colors due to the choice of light active materials for the light emitting layers, the presence of wavelength converting materials etc. Furthermore, the device 20 is optically transparent, as represented by the large downward arrows.

Figure 3A:
FIGS. 3a-d show an example of a method of manufacturing a light emitting device according to the invention.
Figure 3B:
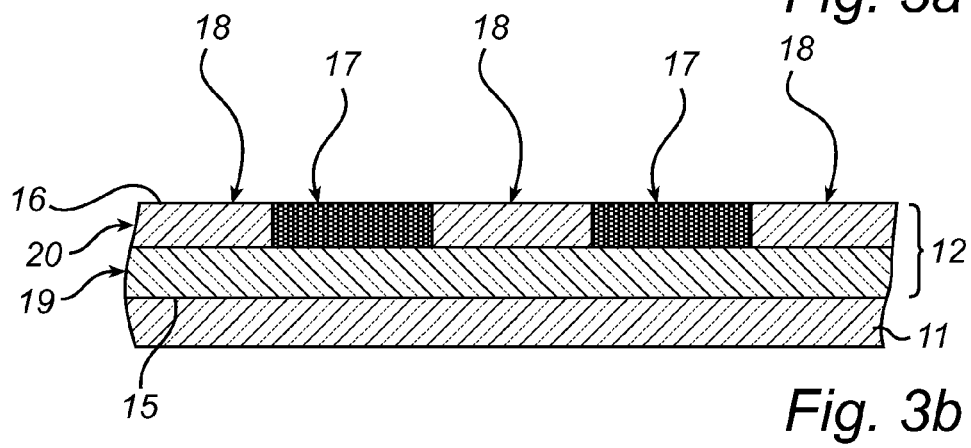
Figure 3C:
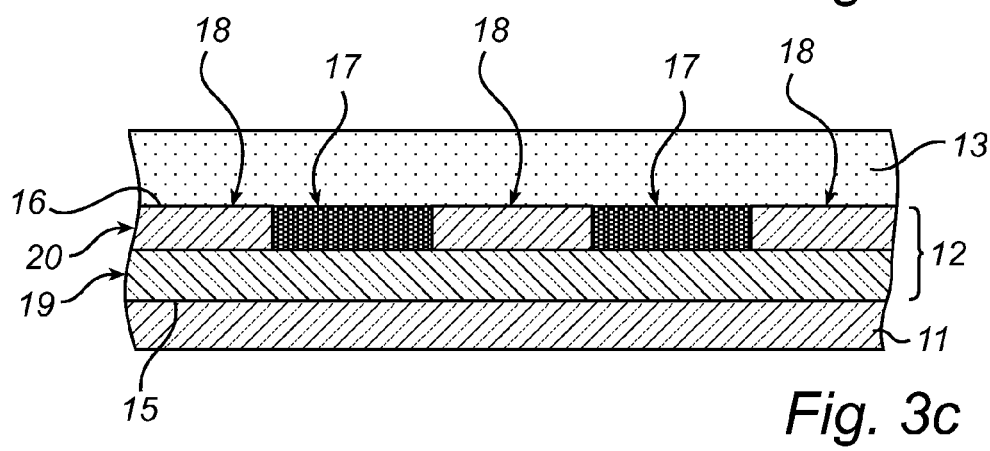
Figure 3D:
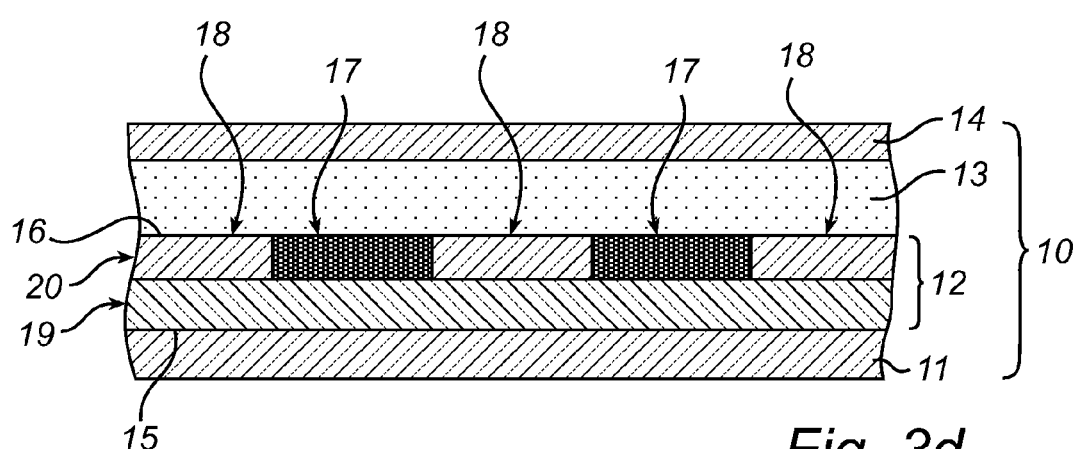

FIG. 3*a*-*d* show an example of a method of manufacturing a light emitting device according to the invention. The method comprises the steps of providing (A) a transparent substrate of for example glass or plastics (FIG. 3*a*); (B) a partly transparent anode layer assembly on the substrate (FIG. 3*b*); (C) a light emitting layer on the anode layer assembly (FIG. 3*c*); and (D) a transparent cathode layer on the light emitting layer (FIG. 3*d*). In the method, the anode layer assembly is provided with a first transparent and conducting surface facing the substrate, and with first domains of a non-transparent conductive material and with second domains of a transparent electrically isolating material. Further, the first domains are in direct contact with the light emitting layer and are arranged to allow electrical contact between the first surface and the light emitting layer.

Figure 4A:
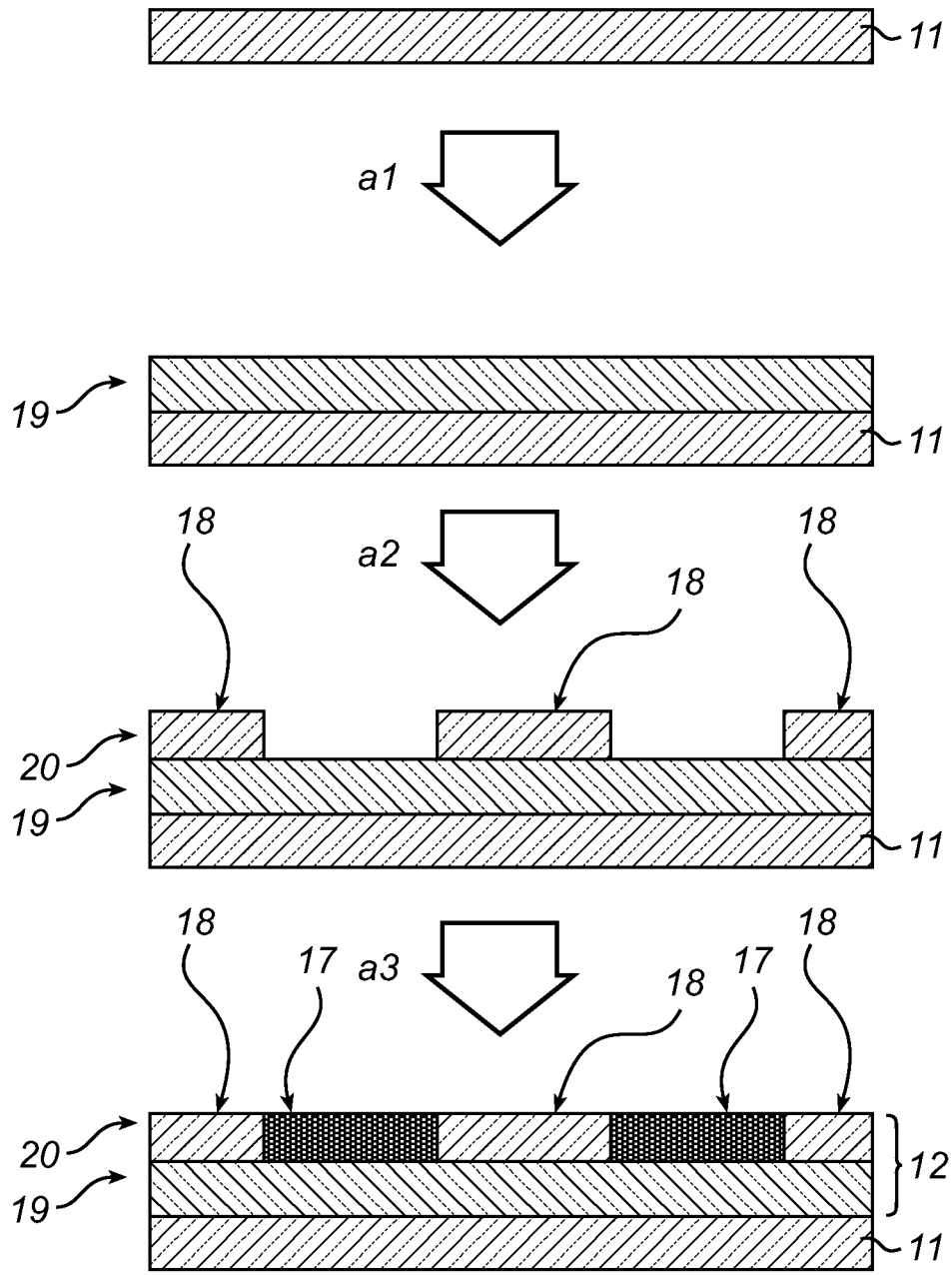
FIGS. 4a, 4b and 4c show three different methods of manufacturing an anode layer according to the invention.
Figure 4B:
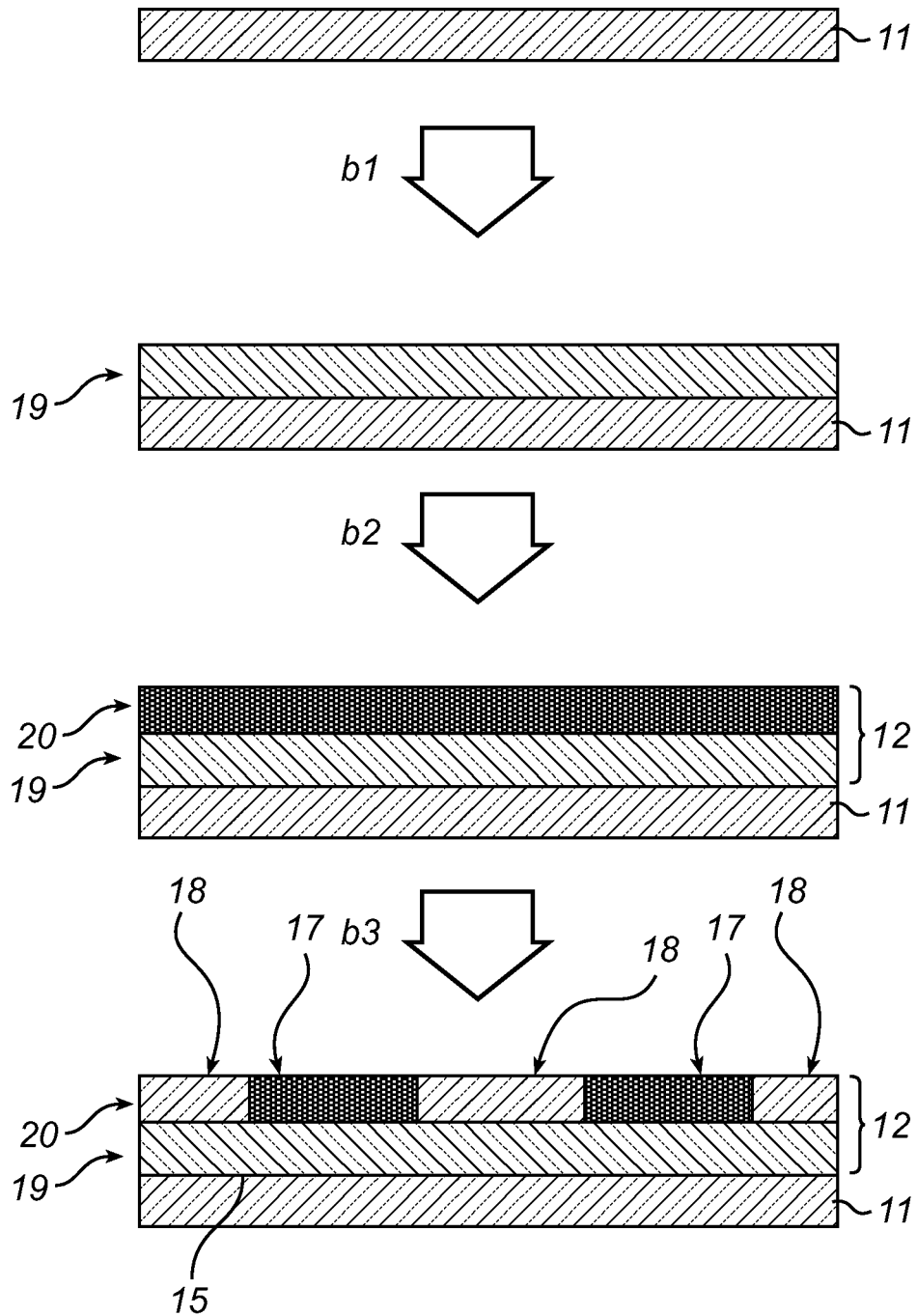
Figure 4C:
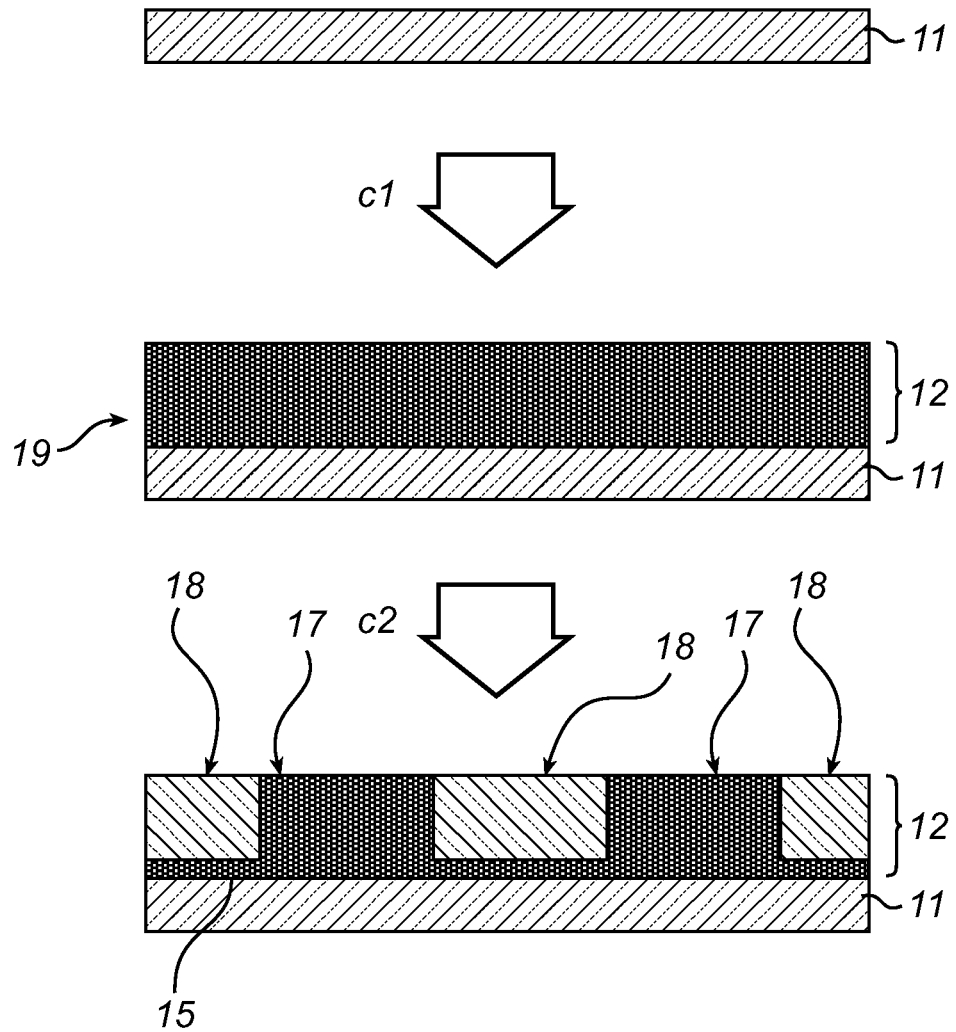

FIGS. 4*a*, 4*b* and 4*c* show three different method steps for manufacturing an anode layer or anode layer assembly according to the invention.

In FIG. 4*a*, an anode layer assembly is provided by (a1) applying a first sub-layer 19 of a transparent conductive material on the substrate 11; (a2) providing a discontinuous second sub-layer 20 of a transparent and electrically isolating material to partially cover the first sub-layer 19; and (a3) applying a non-transparent conductive material in areas on said first sub-layer not covered by said discontinuous second sub-layer. This can be done by for example applying for example ITO on a substrate, then depositing a continuous layer of isolating transparent material such as $SiO_2$ on the ITO layer. In order to convert the continuous isolating layer to a discontinuous layer, parts of the continuous layer is covered with a protective material, such as a conventional organic coating, and then parts of the isolating layer is removed by etching, for example by using a stripper solution or plasma etching. Thereafter, a metal is deposited in the formed holes of the isolating layer using for example electroplating. The protective coating can either be removed directly after the etching step, or removed after the deposition of metal. The latter provides the advantage that metal deposition at areas of the structure where it is undesired can be avoided. Also the metal may be deposited over the whole surface and be removed on the top of the isolating area with e.g. polishing.

In FIG. 4*b*, an anode layer assembly is provided by (b1) applying a first sub-layer 19 of a transparent conductive material; (b2) applying a second sub-layer 20 of a metal or alloy; and (b3) selectively oxidizing the second sub-layer, thereby forming the first and second domains 17, 18. This can be done for example by applying a first sub-layer of ITO on the substrate, then adding a second sub-layer of Al, then covering the parts of the layer assembly that are to be kept conductive (i.e., the first domains), with a structured resist by printing or photolithography, and then oxidizing the uncovered parts of the Al layer down to the ITO layer, hence forming the electrically isolating domains of $Al_2O_3$. Thereafter, the resist may be removed. Alternatively, a conductive inert material is applied on the second sub-layer at the positions where the first domains are desired. The metal domains 17 remain non-transparent, while the oxidized domains 18 become transparent by the oxidation.

In FIG. 4*c*, an anode layer is provided by (c1) applying a layer 12 of a metal or alloy; (c2) selectively oxidizing the surface of the layer 12 to a predetermined depth, thereby defining the first domains 17 of conductive material, which domains have not been reacted in the oxidation, and forming the second domains 18 of non-conductive, oxidized material (oxidized zones). The selective oxidation may be performed by partially covering the second sub-layer; and oxidizing uncovered domains of the second sub-layer down to a predetermined depth. The metal domains 17 remain non-transparent, while the oxidized domains 18 become transparent by the oxidation. The metal layer in the regions below the second domains 18 should provide for transparency. For example, the metal regions below the second domains 18 may be thin enough to be transparent. The metal regions below the second domains 18 may also be provided with pores or channels, or may be discontinuous, so that it allows light to pass through the layer. For example, an oxidation depth corresponding to for example at least 30-70% of the total thickness of the anode layer 12 may be chosen for some applications. Furthermore, if a discontinuous layer is used, this requires that the conductive domains are electrically connected by a network structure of conductive domains, for example a grid patterned structure of the first domains, or that the first domains are electrically connected individually. In some applications where a discontinuous layer is desired, it may be possible to oxidize parts of the domains of the anode layer down to the substrate.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A light emitting device comprising:
    a transparent substrate;
    a partially transparent an anode layer or anode layer assembly arranged on said transparent substrate;
    a light emitting layer arranged on said anode layer; and
    a transparent cathode layer arranged on said light emitting layer; wherein
    said anode layer or anode layer assembly comprises a first surface facing said transparent substrate and a second surface facing said light emitting layer and is positioned opposite to said first surface;
    said first surface comprises a transparent conductive material;
    said second surface comprises a metal layer having first and second domains which metal layer comprises at least one metal or alloy which is in non-oxidized form in said first domains and oxidized in said second domains;
    said first domains are conductive and non-transparent;
    said second domains are transparent and electrically isolating; and
    said first domains are in direct contact with said light emitting layer and are arranged to allow electrical contact between said first surface and said light emitting layer.

2. The light emitting device according to claim 1, herein said first surface comprises a conductive polymer.

3. The light emitting device according to claim 1, wherein said first surface comprises at least one conducting oxide.

4. The light emitting device according to claim 1, wherein said anode layer comprises a metal or alloy layer which is partly in oxidized form, wherein said first surface and said first domains are in non-oxidized form, and said second domains are in oxidized form.

5. The light emitting device according to claim 1, further comprising:
an additional light emitting layer arranged on said cathode; and
an additional partly transparent anode layer or anode layer assembly arranged on said additional light emitting layer,
wherein
said anode layer or anode layer assembly comprises a first surface facing said additional light emitting layer and a second surface positioned opposite to said first surface;
said first surface comprises first and second domains;
said first domains are conductive and non-transparent;
said second domains are transparent and electrically isolating;
said second surface comprises a transparent conductive material, and wherein
said first domains are in direct contact with said light emitting layer and are arranged to allow electrical contact between said second surface and said light emitting layer.

6. An OLED comprising a light emitting device according to claim 1.

7. A method for manufacturing a light emitting device, comprising:
providing a transparent substrate;
providing a partly transparent anode layer or anode layer assembly on said transparent substrate, wherein the anode layer or anode layer assembly has a first transparent and conducting surface facing said transparent substrate, wherein said anode layer or assembly is provided with first domains of non-transparent conductive material and with second domains of transparent electrically isolating material,
providing a light emitting layer on said anode layer; and
providing a transparent cathode layer on said light emitting layer,
wherein said first domains are in direct contact with said light emitting layer and are arranged to allow electrical contact between said first surface and said light emitting layer,
wherein said anode layer is provided either by
applying a first sub-layer of a transparent conductive material;
applying a second sub-layer of a metal or alloy; and
selectively oxidizing said second sub-layer, thereby forming said first and second domains,
or by
applying a layer of a metal or alloy; and
selectively oxidizing the surface of said layer to a predetermined depth, thereby forming said first domains of conductive material and said second domains of electrically isolating material.

8. The method according to claim 7, wherein said selective oxidation is performed by
partially covering said second sub-layer; and
oxidizing uncovered domains of said second sub-layer.

9. The method according to claim 7, wherein applying the anode layer comprises using electroplating of a metal.

* * * * *